(12) United States Patent
Ito et al.

(10) Patent No.: US 7,897,894 B2
(45) Date of Patent: Mar. 1, 2011

(54) LASER MACHINING APPARATUS FOR SHEET-LIKE WORKPIECE

(75) Inventors: Yasushi Ito, Ebina (JP); Tatsuo Sato, Ebina (JP)

(73) Assignee: Hitachi Via Mechanics, Ltd., Kanagawa-Ken (JP)

(*) Notice: Subject to any disclaimer, the term of this patent is extended or adjusted under 35 U.S.C. 154(b) by 839 days.

(21) Appl. No.: 11/100,521

(22) Filed: Apr. 7, 2005

(65) Prior Publication Data

US 2005/0224476 A1    Oct. 13, 2005

(30) Foreign Application Priority Data

Apr. 8, 2004    (JP) .............................. 2004-114508

(51) Int. Cl.
*B23K 26/02* (2006.01)
(52) U.S. Cl. .............................. 219/121.82; 219/121.6; 219/121.85
(58) Field of Classification Search ............ 219/121.82, 219/121.6, 121.85
See application file for complete search history.

(56) References Cited

U.S. PATENT DOCUMENTS 3,226,527 A * 12/1965 Harding ....................... 219/384
5,767,480 A * 6/1998 Anglin et al. .......... 219/121.69
5,853,530 A   12/1998 Allen
2004/0154749 A1* 8/2004 Rice ........................... 156/363

FOREIGN PATENT DOCUMENTS

JP    03-019249    1/1991
JP    2000-143052    5/2000

* cited by examiner

*Primary Examiner*—M. Alexander Elve
(74) *Attorney, Agent, or Firm*—Wenderoth, Lind & Ponack, L.L.P.

(57) ABSTRACT

There is provided a laser machining apparatus for sheet-like workpieces that allows an installation area to be reduced and that may be readily controlled. The laser machining apparatus includes a Y-table movable in X- and Y-plane directions orthogonal to a laser beam irradiated from an fθ lens, a supply reel for holding a supply-side roll which contains a sheet-like workpiece, and a take-up reel for holding a take-up side roll containing a finished sheet-like workpiece. Machining is carried out by fixing the sheet-like workpiece in the machining area on the movable table and by irradiating the laser beam while moving the movable table relative to the laser beam. At least one of the supply reel and the take-up reel is disposed on the movable table.

4 Claims, 3 Drawing Sheets

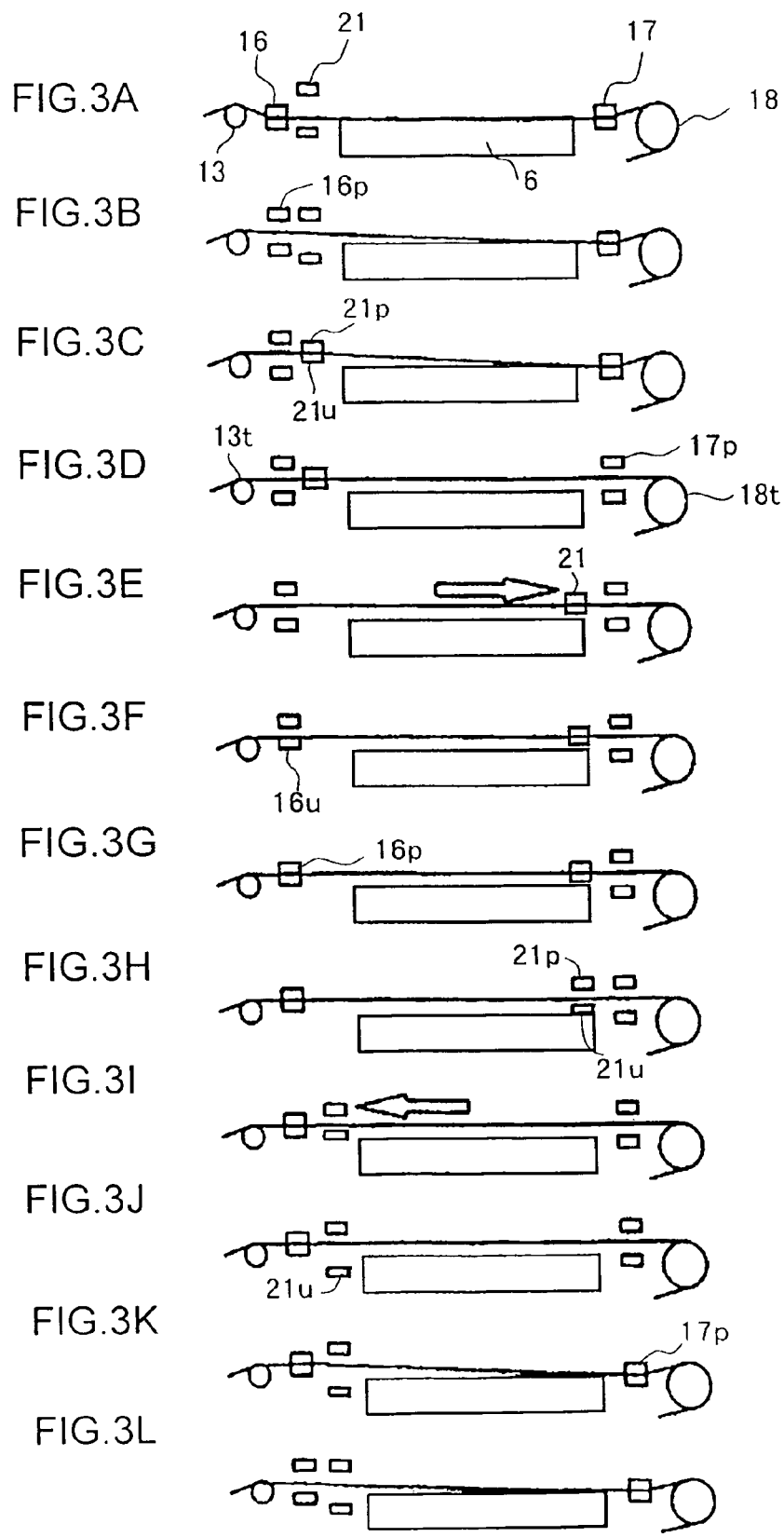

LASER MACHINING APPARATUS FOR SHEET-LIKE WORKPIECE

BACKGROUND OF THE INVENTION

1. Field of the Invention

The present invention relates to a laser machining apparatus for repeatedly machining a sheet-like workpiece by positioning and fixing the sheet-like workpiece on a machining area on a movable table and by relatively moving the movable table and laser machining means.

2. Description of Related Art

Japanese Patent Laid-Open No. 2000-246479 has disclosed a sort of laser machining apparatus comprising a movable table on which an area-to-be-machined a sheet-like workpiece is fixed and which is movable in three axial directions. A laser beam irradiating means is provided for irradiating a laser beam to the flexible printed board. A roll-out unit is disposed on one side of the machining apparatus for rolling out a non-machined flexible printed board rolled up in a roll. A take-up unit is disposed on the other side of the machining apparatus and is for taking up the flexible printed board whose machining has been finished so that the sheet-like workpiece forms a certain length of free loops (sag) between the machining apparatus and the roll-out unit and between the machining apparatus and the take-up unit, respectively, to allow the movable table to move during machining.

However, the apparatus has had a problem that its overall installation area is large because there has to be an enough distance between the machining apparatus and the roll-out unit, and between the machining apparatus and the take-up unit in order to prevent the flexible printed board from being damaged by a twist or the like caused when the movable table moves during machining.

BRIEF SUMMARY OF THE INVENTION

It is therefore an object of the invention to provide a laser machining apparatus for sheet-like workpieces which requires less installation area and which may be readily controlled.

In order to solve the abovementioned problems, according to a first aspect of the invention, a laser machining apparatus for machining sheet-like workpieces comprises:

laser beam irradiating means installed on a bed and capable of irradiating a laser beam;

a movable table provided so as to be movable at least in plane directions (X- and Y-plane directions) orthogonal to the laser beam;

a supply-side roll holding device for holding a supply-side roll in which a sheet-like workpiece is rolled up in a roll and capable of supplying the sheet-like workpiece to the movable table; and a take-up side roll holding device for holding a take-up side roll in which the sheet-like workpiece whose machining has been finished is rolled up in a roll and capable of taking up the sheet-like workpiece on the movable table: and machines the sheet-like workpiece in a machining area on the movable table by fixing the sheet-like workpiece placed on the machining area on the movable table and by irradiating the laser beam thereto by the laser beam irradiating means while relatively moving the movable table and the laser beam irradiating means during machining:

wherein at least one of the supply-side roll holding device and the take-up side roll holding device is disposed on the movable table.

According to a second aspect of the invention, the supply-side roll holding device and the take-up side roll holding device are disposed on one side of the machining area on the movable table.

According to a third aspect of the invention, the laser machining apparatus further comprises moving means for holding and moving the sheet-like workpiece by a desirable distance in the take-up direction in taking up and supplying the sheet-like workpiece by the take-up side roll holding device and the supply-side roll holding device after machining.

Structuring the laser machining apparatus as described above allows at least one space where a free loop of the sheet-like workpiece is formed to be eliminated, so that an overall installation area thereof may be reduced. Still more, the apparatus may be readily controlled because it is composed of fewer components.

Additional objects and advantages of the invention will be apparent from the following detailed description of a preferred embodiment thereof, which are best understood with reference to the accompanying drawings.

BRIEF DESCRIPTION OF THE DRAWINGS

FIGS. 3A through 3L are drawings illustrating operation of the invention.

DETAILED DESCRIPTION OF THE INVENTION

Figure 1:
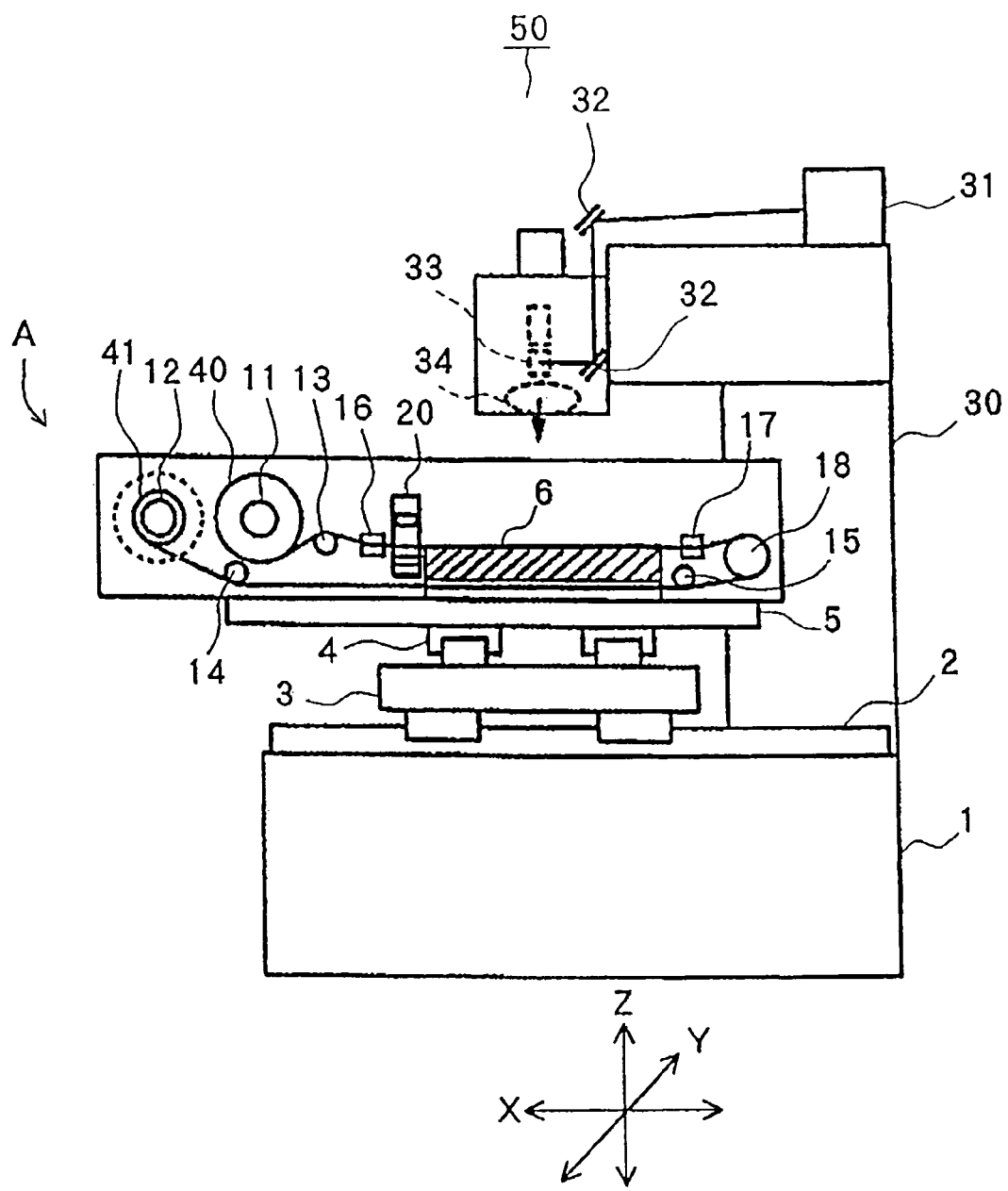
FIG. 1 is a front partial section view of a laser machining apparatus of the invention.

The present invention will be explained below based on an embodiment thereof shown in the drawings.

Figure 2:
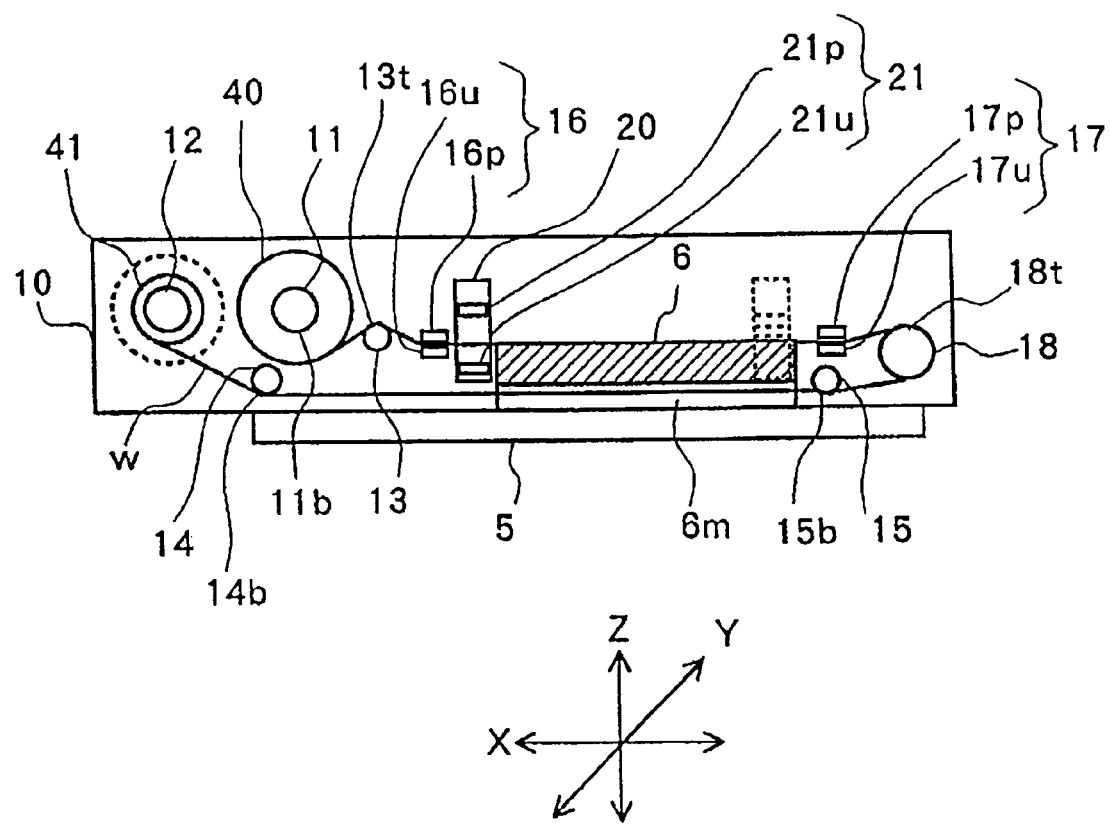
FIG. 2 is an enlarged view of a part A in FIG. 1.

FIG. 1 is a front partial section view of a laser machining apparatus of the invention and FIG. 2 is an enlarged view of a part A in FIG. 1.

In the inventive laser machining apparatus 50, a gate-type column 30 is fixedly installed on a bed 1. Disposed on the column 30 are a laser oscillator 31, a plurality of mirrors 32 (two in FIG. 1), a pair of mirrors 33 and an fθ lens 34.

A linear guide 2 is disposed on the upper face of the bed 1. The linear guide 2 allows an X-table 3 to move on the bed 1 in the X direction. A linear guide 4 is disposed on the upper face of the X-table 3. The linear guide 4 allows a Y-table (movable table) 5 to move on the X-table 3 in the Y direction. From the structure described above, the Y-table 5 is movable in the X and Y directions with respect to the bed 1.

As shown in FIG. 2, a machining table 6 and a reel holder 10 are disposed on the upper face of the Y-table 5. A channel 6m having a lateral width wider than that of a sheet-like workpiece (hereinafter referred to simply as a "workpiece") w is formed in the Y direction at the under face of the machining table 6. A plurality of holes connected with a hollow section (not shown) within the table are formed on the upper face of the machining table 6 and the hollow section (not shown) within the table is connected to a vacuum source (not shown). Disposed on the reel holder 10 are a supply reel 11, a take-up reel 12, guide rollers 13, 14 and 15, clampers 16 and 17, a return roller 18 and a workpiece conveying device (moving means) 20.

The supply reel 11 is disposed on the reel holder 10 so that a lower end 1ib of a shaft thereof is positioned on a level below an upper end 13t of the guide roller 13 and is rotatable by means of a motor (not shown). That is, the supply reel 11 holds a supply-side roll 40 in which the non-finished workpiece w is rolled up in a roll and is capable of supplying the workpiece w when it is driven by a motor (not shown) (supply-side roll holding device).

The take-up reel 12 is disposed so that a lower end of a take-up side roll 41 of the workpiece w which has been taken up is positioned on a level above a lower end 14b of the guide roller 14 and is rotatable by means of a motor (not shown). That is, the take-up reel 12 holds the take-up side roll 41 in which the finished workpiece w is taken up in a roll and is capable of taking up the workpiece w when it is driven by the motor (not shown) (take-up side roll holding device).

The rotatable guide roller 13 is supported by the reel holder 10 so that an upper end 13t thereof is positioned on a level above the surface of the machining table 6. The rotatable guide rollers 14 and 15 are supported by the reel holder 10 so that lower ends 14b and 15b thereof are positioned on a level under the bottom face of the channel 6m.

The clampers 16 and 17 are composed of receptacles 16u and 17u and pressers 16p and 17p disposed so as to face to the receptacles 16u and 17u. These components, except of the receptacle 17u, are movable in the Z direction (vertical direction in the figure) respectively by means (not shown). A standby position of the receptacle 16u is its lowering end and at this time, its upper face is positioned on a level lower than the surface of the machining table 6. When it is located at its raising end, its upper face is positioned on the same level with the upper end 13t of the guide roller 13. A lowering end of the presser 16p is located on a level far below the upper face of the receptacle 16u located at its standby position so that the lower face of the presser 16p can press the upper face of the receptacle 16u located at its standby position. Still more, the lowering end of the presser 17p is located on a level far below the upper face of the receptacle 17u so that the lower face of the presser 17p can press the upper face of the receptacle 17u.

The rotatable return roller 18 is supported by the reel holder 10 so that its upper end 18t is positioned on the same level with the upper end 13t of the guide roller 13.

The workpiece conveying device 20 may be moved and positioned in the X direction with respect to the reel holder 10 by means (not shown) such as a motor and a guide rail mechanism. The workpiece conveying device 20 supports a clamper 21. The clamper 21 is composed of a presser 21p and a receptacle 21u movable in the vertical direction. A standby position of the receptacle 21u is the position where its upper face is on a level lower than the upper face of the machining table 6 and its raising end is on the same level with the upper end 13t of the guide roller 13 and the upper end 18t of the return roller 18 as shown in FIG. 2 by solid lines. A standby position of the presser 21p is the position where the lower end thereof is located on a level above the upper end 13t of the guide roller 13 and the upper end 18t of the return roller 18 and its lowering end is located on a level far below the upper end of the receptacle 21u located at its raising end so that the lower face thereof can press the upper face of the receptacle 21u located at its raising end. It is noted that the standby position of the workpiece conveying device 20 in the X direction is located at the left end of a movement and is shown by the solid lines in the figure and device 20 is shown by dotted lines in the figure at a right end of the movement.

Next, operations of the laser machining apparatus 50 will be explained with reference to FIG. 3. FIG. 3 is an explanatory diagram showing the inventive operation of the laser machining apparatus 50.

Prearrangement operations will be explained at first.

The supply-side roll 40 is supported by the supply reel 11, the workpiece w is wound around the return roller 18 and is then passed through the channel 6m of the machining table 6 to fasten an end of workpiece w to the take-up reel 12 (the take-up-side roll 41) as shown in the figures while opening all the clampers 16, 17 and 21 beforehand (by positioning the receptacles 16u and 21u to their standby position and the pressers 16p, 17p and 21p to their raising end, respectively).

Next, the presser 16p is put into an operative position, i.e., is lowered, to fasten the workpiece w between it and the receptacle 16u while applying clockwise torque to the supply reel 11 and the take-up reel 12 as shown in FIG. 3A. Next, the presser 17p is put into an operative position, i.e., is lowered, to fasten the workpiece w between it and the receptacle 17u. As a result, the workpiece w is fixed on the surface of the machining table 6 without looseness. A vacuum source (not shown) is put into operation in this state to adhere the workpiece w closely on the surface of the machining table 6.

In succession, machining is carried out. That is, the laser oscillator 31 is put into operation and a laser beam emitted from the laser oscillator 31 is led to the mirrors 33 via the mirrors 32. Then, the laser beam is positioned by the galvanic scanner mirror 33 and is put into the workpiece w after vertically aligning an optical axis of the laser beam by the fθ lens 34 to machine the workpiece w. After machining an area determined by the fθ lens 34, machining of a next area is carried out by moving the X-table 3 or the Y-table 5.

Next, steps for moving the workpiece after machining will be explained.

After machining, the vacuum source (not shown) is stopped and then the presser 16p is raised as shown in FIG. 3B.

Next, the clamper 21 is put into an operative position, i.e., the presser 21p is lowered after raising the receptacle 21u to hold the workpiece w by the presser 21p and the receptacle 21u as shown in FIG. 3C.

Next, the presser 17p is raised as shown in FIG. 3D. As a result, the workpiece w is positioned on a level of the upper end 13t of the guide roller 13 and the upper end 18t of the return roller 18.

In this state, the workpiece conveying device 20 is moved to the right in the figure by a desirable distance as shown in FIG. 3E. It is noted that in this state, the machined workpiece w is taken up by the take-up reel 12 while supplying the workpiece w by the supply reel 11.

Next, the receptacle 16u is moved to its raising end as shown in FIG. 3F and then the presser 16p is lowered to hold the workpiece w by the clamper 16 as shown in FIG. 3G.

Next, the clamper 21 is released as shown in FIG. 3H. At this time, the presser 21p is moved to its raising end and the receptacle 21u is moved to the position where its upper face does not contact with the workpiece w and also with the upper face of the machining table 6. Then, the workpiece conveying device 20 is returned to its standby position as shown in FIG. 3I.

Next, the receptacle 21u is positioned to its standby position as shown in FIG. 3J and then the presser 17p is lowered as shown in FIG. 3K to hold the workpiece w by the clamper 17.

Then, the clamper 16 is released as shown in FIG. 3L.

After that, the receptacle 16u is positioned to its standby position and the presser 16p is lowered to hold the workpiece w by the clamper 16 (see FIG. 3A). Then, the vacuum source (not shown) is put into operation to adhere the workpiece w closely to the machining table to carry out subsequent machining of workpiece w. These steps are repeated in the same manner thereafter.

During the steps and machining described above, the motor for rotating the supply reel 11 and the take-up reel 12 is driven with torque of a range that causes no ill-effect on the workpiece w and is controlled so as to apply a tensile force to the workpiece w so that the workpiece causes no looseness. Note that it is possible to arrange so that a tensile force is applied to the workpiece w so that the workpiece causes no looseness by urging the guide rollers 13 and 14 or the return roller 18 in predetermined directions by springs or the like.

As described above, the inventive laser machining apparatus 50 for sheet-like workpieces allows eliminating the space where a free loop of the sheet-like workpiece is formed and thereby allows decreasing an overall installation area of the laser machining apparatus 50. Moreover, it may be readily controlled because it requires fewer components.

Furthermore, since the supply reel 11 and the take-up reel 12 are disposed on one side on the Y-table 5, the overall installation area of the laser machining apparatus 50 may be decreased as compared to the case of disposing them on the both sides of the Y-table 5.

It is noted that although the case of disposing both the supply reel 11 and the take-up reel 12 on the Y-table 5 has been explained in the embodiment described above, at least one free loop may be reduced by disposing at least one of the supply reel 11 and the take-up reel 12 on the Y-table 5. Accordingly, the overall installation area of the laser machining apparatus 50 may be reduced as compared to the conventional one.

While the preferred embodiments have been described, variations thereto will occur to those skilled in the art within the scope of the present inventive concepts which are delineated by the following claims.

What is claimed is:

1. A laser machining apparatus for machining sheet-like workpieces, said apparatus comprising:

a table disposed on a bed and configured to move in a plane;

a laser beam generating device configured to generate a laser beam orthogonal to the plane and being coupled to the bed;

a supply-side roll holding device and a take-up side roll holding device disposed on said table so as to be moved together in the plane with said table;

a supply-side roll coupled to said supply-side roll holding device, said supply-side roll containing the sheet-like workpieces and configured to supply the sheet-like workpieces to said table;

a take-up side roll coupled to said take-up side roll holding device, said take-up side roll configured to receive finished sheet-like workpieces from said table; and a machining area defined on said table, said machining area configured to receive and fix the sheet-like workpieces thereto and move with the sheet-like workpieces relative to the laser beam during machining.

2. The laser machining apparatus for machining sheet-like workpieces as set forth in claim 1, wherein said supply-side roll holding device and said take-up side roll holding device are disposed on one side of said machining area.

3. The laser machining apparatus for machining sheet-like workpieces as set forth in claim 1, further comprising moving means for holding and moving the sheet-like workpiece by a distance in a take-up direction in taking up and supplying the sheet-like workpiece by said take-up side roll holding device and by said supply-side roll holding device after machining.

4. The laser machining apparatus for machining sheet-like workpieces as set forth in claim 2, further comprising moving means for holding and moving the sheet-like workpiece by a distance in a take-up direction in taking up and supplying the sheet-like workpiece by said take-up side roll holding device and by said supply-side roll holding device after machining.

* * * * *